United States Patent
Seto

(10) Patent No.: US 10,060,967 B2
(45) Date of Patent: Aug. 28, 2018

(54) TESTING APPARATUS AND METHOD FOR TESTING SEMICONDUCTOR CHIPS

(71) Applicant: Toshiba Memory Corporation, Tokyo (JP)

(72) Inventor: Motoshi Seto, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 532 days.

(21) Appl. No.: 14/474,304

(22) Filed: Sep. 2, 2014

(65) Prior Publication Data
US 2015/0212147 A1    Jul. 30, 2015

(30) Foreign Application Priority Data
Jan. 28, 2014  (JP) .................................. 2014-013521

(51) Int. Cl.
*G01R 31/265* (2006.01)
*G01R 31/28* (2006.01)

(52) U.S. Cl.
CPC ...... *G01R 31/2653* (2013.01); *G01R 31/2831* (2013.01)

(58) Field of Classification Search
CPC . G01R 31/2653; G01R 31/2831; G01N 23/00
See application file for complete search history.

(56) References Cited

U.S. PATENT DOCUMENTS

| | | | | |
|---|---|---|---|---|
| 7,968,844 | B2* | 6/2011 | Kim ...................... | H01J 37/244 250/310 |
| 2002/0028536 | A1* | 3/2002 | Hirano .................. | H01L 21/486 438/112 |
| 2005/0045821 | A1* | 3/2005 | Noji ...................... | G01N 23/225 250/311 |
| 2005/0082476 | A1* | 4/2005 | Hiroi ...................... | H01J 37/28 250/310 |
| 2007/0057687 | A1* | 3/2007 | Kadyshevitch ...... | G01R 31/307 324/754.22 |

(Continued)

FOREIGN PATENT DOCUMENTS

| | | |
|---|---|---|
| JP | S6143441 A | 3/1986 |
| JP | 2001210689 A | 8/2001 |

(Continued)

OTHER PUBLICATIONS

Japanese Office Action dated Sep. 13, 2016, filed in Japanese counterpart Application No. 2014-013521, 8 pages (with translation).

*Primary Examiner* — Minh Phan
*Assistant Examiner* — Zannatul Ferdous
(74) *Attorney, Agent, or Firm* — Patterson & Sheridan, LLP

(57) ABSTRACT

A testing apparatus for a wafer having a plurality of semiconductor chips, each including one or more vias, includes an electron beam discharging unit, a detecting unit, and a controller. The electron beam discharging unit is configured to discharge an electron beam to a via of one of the semiconductor chips. The detecting unit generates a detection signal corresponding to a current flowing through the via. The controller is configured to record a value of the detection signal in association with a position of the semiconductor chip.

16 Claims, 14 Drawing Sheets

(56) References Cited

U.S. PATENT DOCUMENTS

| | | |
|---|---|---|
| 2008/0135754 A1 | 6/2008 | Eto |
| 2012/0119999 A1 | 5/2012 | Harris |
| 2012/0235036 A1* | 9/2012 | Hatakeyama ...... G01N 23/2251 250/310 |

FOREIGN PATENT DOCUMENTS

| | | |
|---|---|---|
| JP | 2003302437 A | 10/2003 |
| JP | 2004071954 A | 3/2004 |
| JP | 2009105247 A | 5/2009 |
| JP | 2012-156026 A | 8/2012 |

* cited by examiner

DETAILS OF S1

DETAILS OF S3

VIII-VIII' SECTION

XI-XI' SECTION

TESTING APPARATUS AND METHOD FOR TESTING SEMICONDUCTOR CHIPS

CROSS-REFERENCE TO RELATED APPLICATION

This application is based upon and claims the benefit of priority from Japanese Patent Application No. 2014-013521, filed Jan. 28, 2014, the entire contents of which are incorporated herein by reference.

FIELD

Embodiments described herein relate generally to a testing apparatus and a method for testing semiconductor chips.

BACKGROUND

A plurality of semiconductor chips is stacked to each other in forming a semiconductor device. In order to electrically connect the stacked semiconductor chips, a through silicon via (hereinafter TSV) that passes through a semiconductor chip is formed in each of the semiconductor chips. With such TSVs, power can be supplied to each of the stacked semiconductor chips.

DESCRIPTION OF THE DRAWINGS

FIG. 1A is a top view of a silicon wafer, FIG. 1B is a sectional view of the silicon wafer taken along the line I-I' of FIG. 1A, and FIG. 1C is a conceptual diagram illustrating a plurality of semiconductor chips that are stacked.

FIG. 3A is a conceptual diagram of a macro-alignment method, and FIG. 3B is a conceptual diagram of a micro-alignment method.

FIG. 8A is a plan view, and FIG. 8B is a sectional view of the silicon wafer and the conductive sheet.

DETAILED DESCRIPTION

One embodiment provides a testing apparatus for a wafer having a plurality of semiconductor chips and a testing method capable of detecting TSV defects of the semiconductor chips.

In general, according to one embodiment, a testing apparatus for a wafer having a plurality of semiconductor chips, each including one or more vias, includes an electron beam discharging unit, a detecting unit, and a controller. The electron beam discharging unit is configured to discharge an electron beam to a via of one of the semiconductor chips. The detecting unit generates a detection signal corresponding to a current flowing through the via. The controller is configured to record a value of the detection signal in association with a position of the semiconductor chip.

The testing apparatus according to one embodiment determines whether or not the TSV in each of semiconductor chips has a defect (an open defect) in a state before the silicon wafer is divided into the semiconductor chips. Specifically, a device of an electron beam absorbed current (EBAC) is employed to cause a current in the TSV, and the current is detected by an amplifier to determine whether or not the TSV is electrically conducted.

First Embodiment

1. Silicon Wafer and Conductive Sheet

Figure 1A:
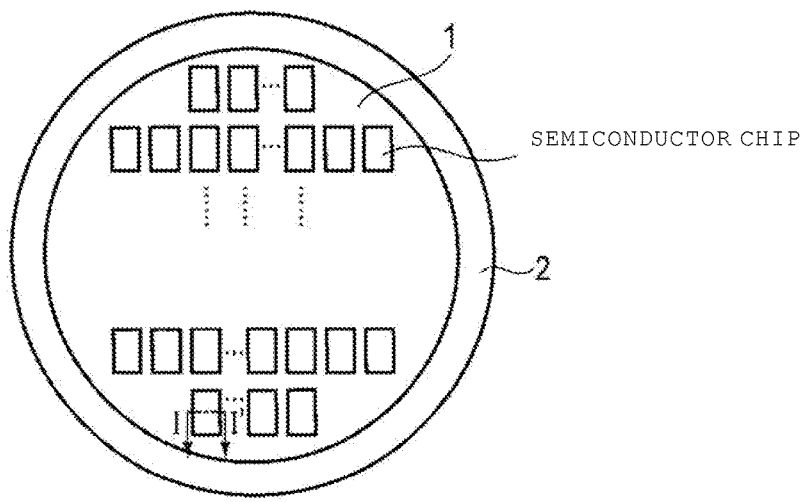
FIGS. 1A to 1C are views of a silicon wafer and a conductive sheet used in a testing method according to a first embodiment.
Figure 1B:
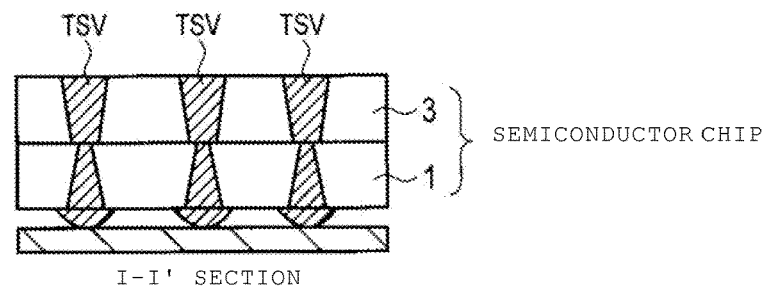

A first embodiment will be described referring to FIGS. 1A to 1C. FIGS. 1A and 1B show a state where a conductive sheet described below is attached to a silicon wafer. FIG. 1A shows a top view of the silicon wafer, and FIG. 1B shows a sectional view of the silicon wafer taken along a line I-I' in FIG. 1A.

As illustrated in FIG. 1A, the silicon wafer according to the first embodiment includes a plurality of semiconductor chips. The plurality of semiconductor chips is arranged in a matrix form. Conventionally, after the semiconductor chips are formed, for example, a die sort test (hereinafter, referred to as a DS test) is performed, and a semiconductor chip that is determined to be not defective is extracted from the silicon wafer.

In this embodiment, after the DS test is performed, the rear surface of the silicon wafer is attached to a conductive sheet 2.

Here, the conductive sheet 2 is preferred to satisfy at least the following requirements.

(a) When light (for example, UV light) is radiated, adhesive power to the silicon wafer decreases.

(b) Conductivity (c) When the conductive sheet 2 is separated from the silicon wafer, a part of an adhesive does not remain on the silicon wafer.

Although the wavelength of light radiated onto the conductive sheet 2 is regulated UV light (<350 nm), if the conductive sheet 2 satisfies the requirements (a) and (c), light of a different wavelength may be used. Since the conductive sheet 2 is attached to the entire surface of the silicon wafer in this embodiment, the conductive sheet 2 is preferred to have at least a size substantially equal to the size of the silicon wafer. For example, as illustrated in FIG. 1A, the conductive sheet 2 may have a circular shape.

Next, the configuration of the semiconductor chip will be described.

FIG. 1B is a sectional view of the semiconductor chip taken along the line I-I'. A detail structure of a semiconductor element 3 formed on a silicon substrate 1 is not illustrated. The semiconductor element 3 includes, for example, a memory cell array, peripheral circuits, and the like. As illustrated in FIG. 1B, the semiconductor element 3 is formed on the silicon substrate 1, thereby forming a semiconductor chip.

TSV1-TSV3 are formed so as to pass through the silicon substrate 1 and the semiconductor element 3. Here, although three TSVs are formed as an example, the number of the TSVs formed in a semiconductor chip is not limited thereto.

As illustrated in FIG. 1B, the rear surfaces of TSV1 to TSV3 are attached to the above-described conductive sheet 2. At this time, the conductive sheet 2 is electrically connected to TSV1-TSV3.

Figure 1C:
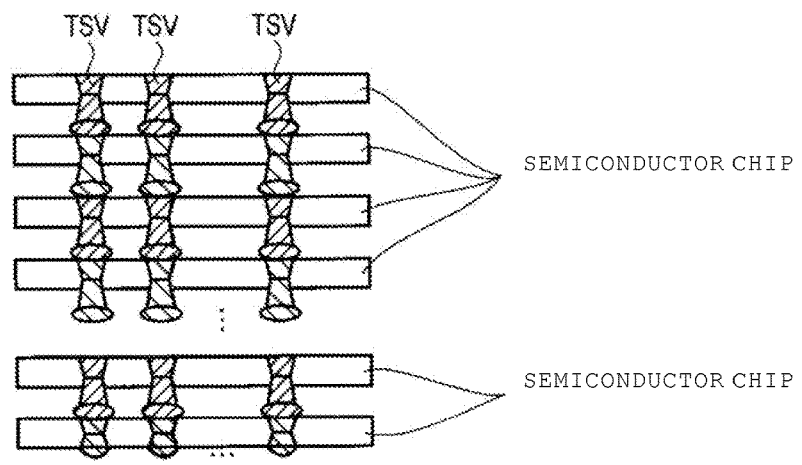

As illustrated in FIG. 1C, for example, a plurality of semiconductor chips are stacked (for example, ten stages), thereby forming a semiconductor device. The semiconductor device is mounted in, for example, a SD Card™ or a SSD™.

FIG. 1C shows a plurality of stacked semiconductor chips. As illustrated in FIG. 1C, the plurality of semiconductor chips is electrically connected together through the TSVs formed in the respective semiconductor chips. A voltage is applied from the outside to the TSVs through, for example, BGA solder balls, thereby driving the semiconductor element in each of the semiconductor chips. That is, if there is an open defect in one TSV among the plurality of TSVs, a semiconductor chip may not normally operate. As the open defect, for example, there is a defect that a void is included in the TSV and the upper and lower ends of the TSV are not electrically connected.

In this embodiment, such a TSV defect in a semiconductor chip is detected using an EBAC described below before a semiconductor chip is extracted from a silicon wafer.

2. Configuration Example of Testing Apparatus

Figure 2:
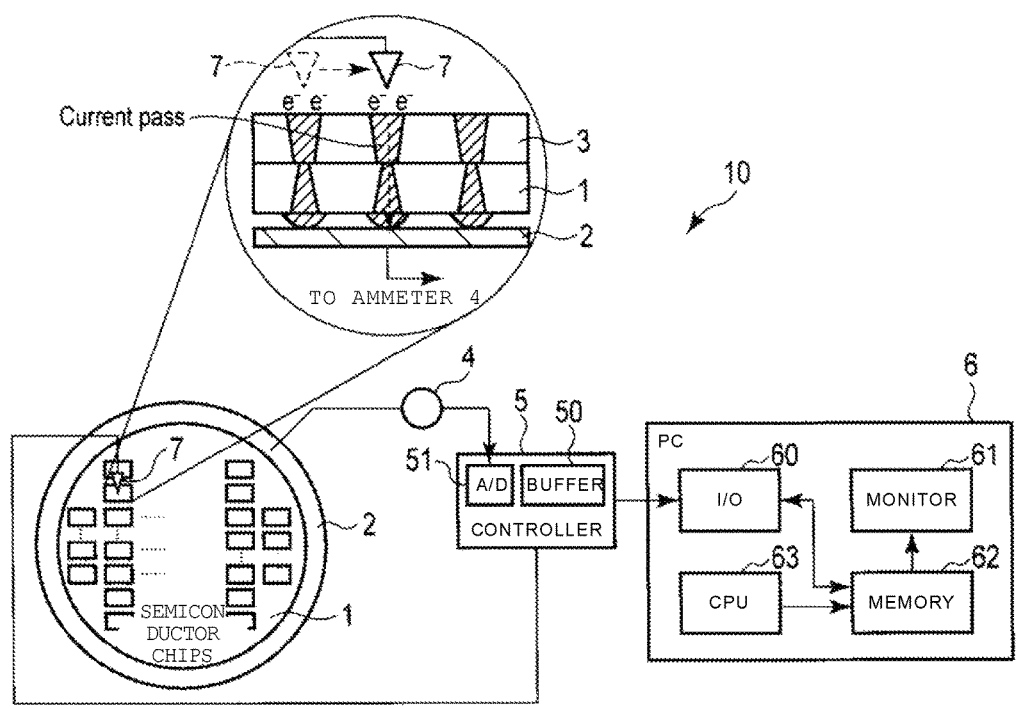
FIG. 2 is a configuration diagram of a testing apparatus according to the first embodiment.

FIG. 2 shows an overall configuration example of a testing apparatus according to the first embodiment. Here, a state in which a silicon wafer having stacked semiconductor elements is set on a stage of an EBAC device is illustrated.

As illustrated in FIG. 2, an EBAC device 10 includes an ammeter 4 (A in FIG. 2), a controller 5, a computer 6 (PC in FIG. 2), and a needle 7.

The controller 5 controls the position of the needle 7. Specifically, the controller 5 moves the needle 7 to a desired TSV provided in the semiconductor chip and then controls the needle 7 such that an electron beam is emitted from the needle 7 toward the TSV.

This state is illustrated in an enlarged view in FIG. 2. As illustrated in the enlarged view, when there is no defect in the TSV, a current flows to the conductive sheet 2 through the TSV in response to the electron beam emitted from the needle 7 (Current Pass in FIG. 2).

On the other hand, when there is a defect in the TSV, even if the electron beam is emitted from the needle 7, a current does not flow to the conductive sheet 2.

An input terminal of the ammeter 4 is connected to the conductive sheet 2, and an output terminal of the ammeter 4 is connected to the controller 5.

That is, the ammeter 4 detects a current flowing through the TSV and the conductive sheet 2 and outputs the current value from the output terminal to the controller 5.

The testing result is, for example, 1 pA and 100 μA.

The controller 5 includes an A/D converter 51 and a buffer 50. In this embodiment, although a configuration in which the A/D converter 51 and the buffer 50 are provided in the controller 5, the configuration of the controller 5 is not limited thereto, and the A/D converter 51 and the buffer 50 may be provided separately from the controller 5.

The A/D converter 51 converts the current value (analog value) supplied from the ammeter 4 to a digital value. The converted current value is the voltage level of "L" level ("0") or "H" level ("1"), and if the TSV is electrically conducted and a current flows through the TSV, the voltage level becomes "H" level. The A/D converter 51 supplies the converted value to the buffer 50.

The buffer 50 stores the converted value and data of a position (X coordinate and Y coordinate) of a corresponding TSV provided in the semiconductor chip. Position data (hereinafter, also referred to as position information) is data for specifying the position of the corresponding TSV to be tested. This data is input from memory 62 (in the drawing, described as I/O) through an input and output unit 60 of the PC 6 described below, and the controller 5 stores this data in the buffer 50.

The position data is input from a keyboard (not shown) to the PC 6. A configuration is not limited to this case, and for example, CAD data stored in an external storage terminal may be read and the position data may be stored in the buffer 50.

The controller 5 counts semiconductor chips at the time of alignment of the silicon wafer described below using the position data. The controller 5 recognizes the number of semiconductor chips arranged in the X direction of each Y coordinate based on the position data0. For this reason, the controller 5 counts the number of semiconductor chips arranged in the X direction with respect to each Y coordinate based on the position data.

When testing whether or not a current flows through the TSV, the controller 5 moves the needle 7 to a predetermined TSV based on the data stored in the buffer 50, and then supplies, for example, a pulsed drive signal to the needle 7. As a result, the controller 5 causes the needle 7 to emit an electron beam toward the TSV.

The controller 5 receives the detection signal ("L" or "H" level) from the ammeter 4 and stores a value of the detection signal in the buffer 50 in association with the position data about the TSV.

The controller 5 outputs the position data stored in the buffer 50 and the associated value to the memory 62 through the input and output unit 60. Accordingly, a monitor 61 displays the testing result of each TSV displayed along with the coordinates.

The PC 6 includes an input and output unit 60, a monitor 61, a memory 62, and a CPU 63.

The input and output unit 60 performs exchange of data between the controller 5 and the personal computer 6. Specifically, the testing result and the position information supplied from the buffer 50 are output to the memory 62, and the position data of the TSVs supplied from the memory 62 is output to the buffer 50.

The monitor 61 displays the position data of the TSVs supplied from the memory 62 by the CPU 63 and the detection result associated with the position information.

Data output to the monitor 61 may include only TSVs in which the output from the ammeter 4 is at "L" level or may include all testing results.

The memory 62 stores the testing result and the position data supplied from the buffer 50, and outputs these to the monitor 61 under the control of the CPU 63.

The memory 62 may store the position data of the TSVs. In this case, as described above, the position data of the memory 62 is transferred to the buffer 50 through the input and output unit 60.

The CPU 63 controls the operation of the PC 6. Specifically, the CPU 63 performs exchange of data with the controller 5 through the input and output unit 60 or performs control of the memory 62 and the monitor 61.

3. Alignment Method

Next, an alignment method according to this embodiment will be described referring to FIGS. 3A and 3B. The alignment method according to this embodiment includes a macro-alignment and a micro-alignment. Hereinafter, the macro-alignment and micro-alignment will be described.

Figure 3A:
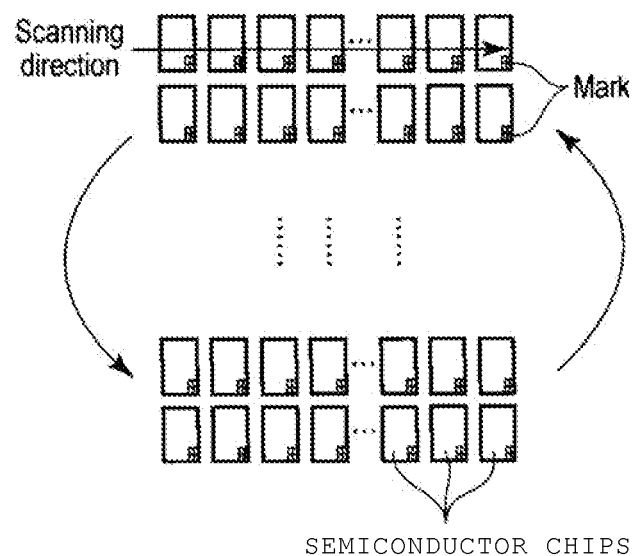
FIGS. 3A and 3B are enlarged views of semiconductor chips according to the first embodiment.
Figure 3B:
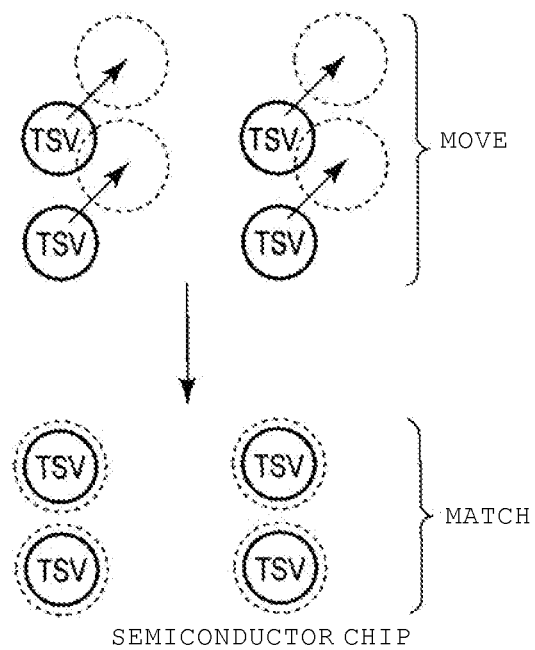

FIG. 3A conceptually describes the macro-alignment, and FIG. 3B conceptually describes the micro-alignment.

3-1. Macro-Alignment

As illustrated in FIG. 3A, for example, an alignment mark is formed at the right corner of each semiconductor chip. In the macro-alignment, for example, the controller 5 moves a monitor for alignment (if a monitor is attached to the needle 7, the needle 7) from right to left along the marks.

For example, the monitor for alignment moves by a distance corresponding to ten semiconductor chips from the right end towards the left end, and when the mark provided at the right corner of the 10th semiconductor chip is deviated from a predetermined position, the controller 5 determines that the position or orientation (for example, X coordinate, Y coordinate, or θ) of the silicon wafer is deviated from a desired position or orientation and moves the silicon wafer to a predetermined position or rotates the silicon wafer at a predetermined angle. The position and orientation of the silicon wafer may be corrected manually, and the position of the silicon wafer may be corrected automatically or the silicon wafer may be rotated automatically by the controller 5.

The position of the silicon wafer is corrected or the silicon wafer is rotated. Thereafter, the needle 7 further moves by a distance of ten semiconductor chips towards the right end, and if the mark provided at the right corner of the 20th semiconductor chip is located at a predetermined position, the macro-alignment is completed.

Of course, for example, if the mark provided at the right corner of the 20th semiconductor chip is deviated from a predetermined position, the correction of the position or orientation of the silicon wafer and the movement of the needle 7 in the right direction are repeated until the deviation disappears.

As the macro-alignment method, although the needle 7 moves from the left end towards the right end in the above-described embodiment, the needle 7 may move from the upper end of the silicon wafer towards the lower end. In this case, the monitor for alignment moves towards the lower end, and when the number of chips is less than or greater than a predetermined number, it is determined that the position or orientation (for example, X coordinate, Y coordinate, or θ) of the silicon wafer is deviated from a desired position or orientation, and the silicon wafer is moved to a predetermined position or is rotated at a predetermined angle.

3-2. Micro-Alignment

Next, the micro-alignment will be described referring to FIG. 3B. In the micro-alignment, as illustrated in FIG. 3B, the monitor for alignment is moved such that the TSVs match the dotted-line circles set in advance.

Specifically, an enlarged semiconductor chip is displayed on the monitor 61 using the monitor for alignment, and the TSVs are brought to match the position data (in FIG. 4B, dotted-line circles) of the TSVs stored in the buffer 50. Note that the micro-alignment is performed by the controller 5. Accordingly, the needle 7 may be moved to a predetermined TSV based on the position data (the position data of the dotted-line circles) of the TSV stored in the buffer 50.

4. Operation of Testing Apparatus 4-1. Operation 1

Figure 4:
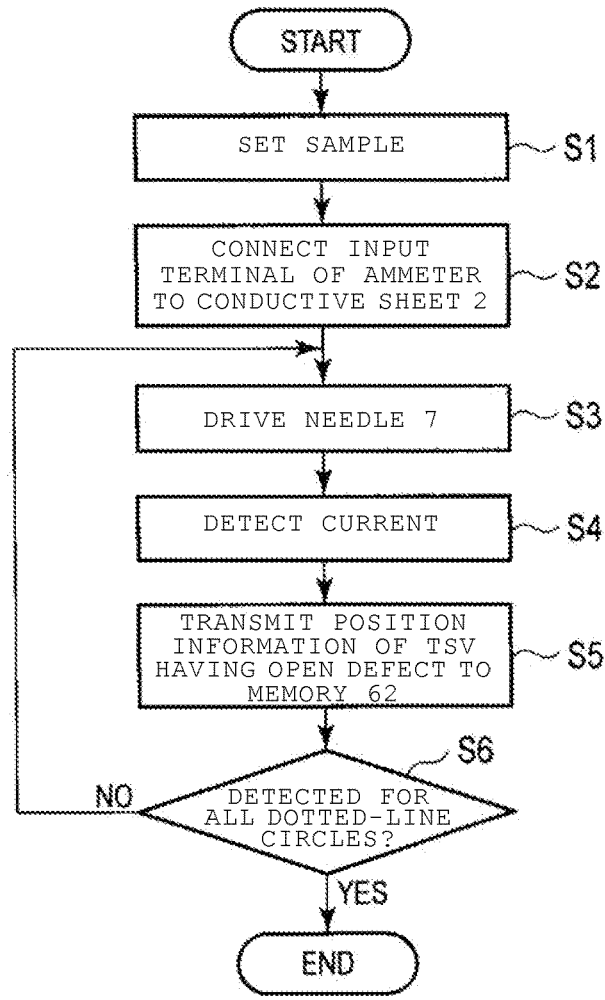
FIG. 4 is a flowchart for detecting TSV defects carried out in the testing method according to the first embodiment.

Next, the operation of the testing apparatus 10 will be described referring to FIG. 4. FIG. 4 is a flowchart illustrating the operation of the testing apparatus 10.

First, the silicon wafer (in the drawing, described as a sample) is set on a sample stage of the EBAC device 10 (Step S1), and next, the input terminal of the ammeter 4 is brought into contact with the conductive sheet 2 under the silicon wafer. As a result, the conductive sheet 2 and the input terminal of the ammeter 4 are electrically connected (S2).

Next, the controller 5 supplies the drive signal to the needle 7 to drive the needle 7 (S3), moves the needle 7 above a predetermined TSV based on data (the position data of the TSV) stored in the buffer 50, and thereafter, causes the needle 7 to emit an electron beam toward the TSV (S4).

Thereafter, the ammeter 4 detects a current flowing from the conductive sheet 2, and supplies the detected current value to the A/D converter 51 of the controller 5. The controller 5 causes the value converted by the A/D converter 51 to be stored in the buffer 50, and supplies the value and the position data to the memory 62 through the input and output unit 60 (S5).

The controller 5 executes the operation of Steps S3 to S6 until the test ends with respect to all TSVs provided in the semiconductor chips, and if the test ends for all TSVs, ends the above-described steps.

4-2. Operation 2

Next, the details of Step S1 will be described referring to FIG. 5.

Figure 5:
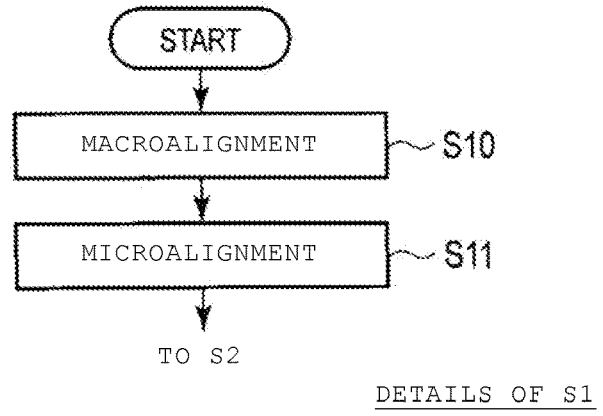
FIG. 5 is a flowchart of the details of Step S1 in FIG. 4.

As illustrated in FIG. 5, when setting the silicon wafer, the above-described macro-alignment is performed using the monitor for alignment (S10). Next, the above-described micro-alignment is performed (S11), and the process goes to the operation of Step S2.

4-3. Operation 3

Next, the details of Step S3 will be described referring to FIG. 6.

Figure 6:
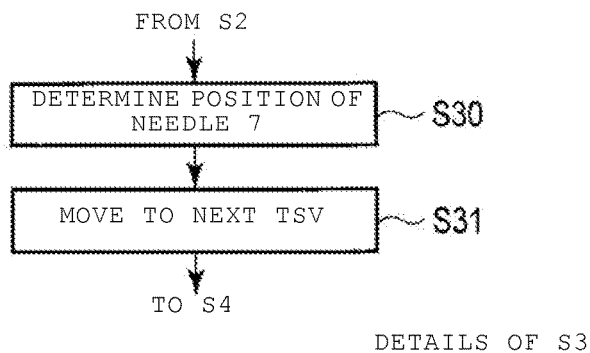
FIG. 6 is a flowchart of the details of Step S3 in FIG. 4.

As illustrated in FIG. 6, the needle 7 is driven, and a TSV to be tested is determined first (S30). After the TSV to be tested is determined, the needle 7 is moved to the TSV to be tested by the controller 5 (S31), and the process goes to Step S4.

5. Test Result

Next, the test result according to the above-described flowchart will be described referring to FIG. 7.

Figure 7:
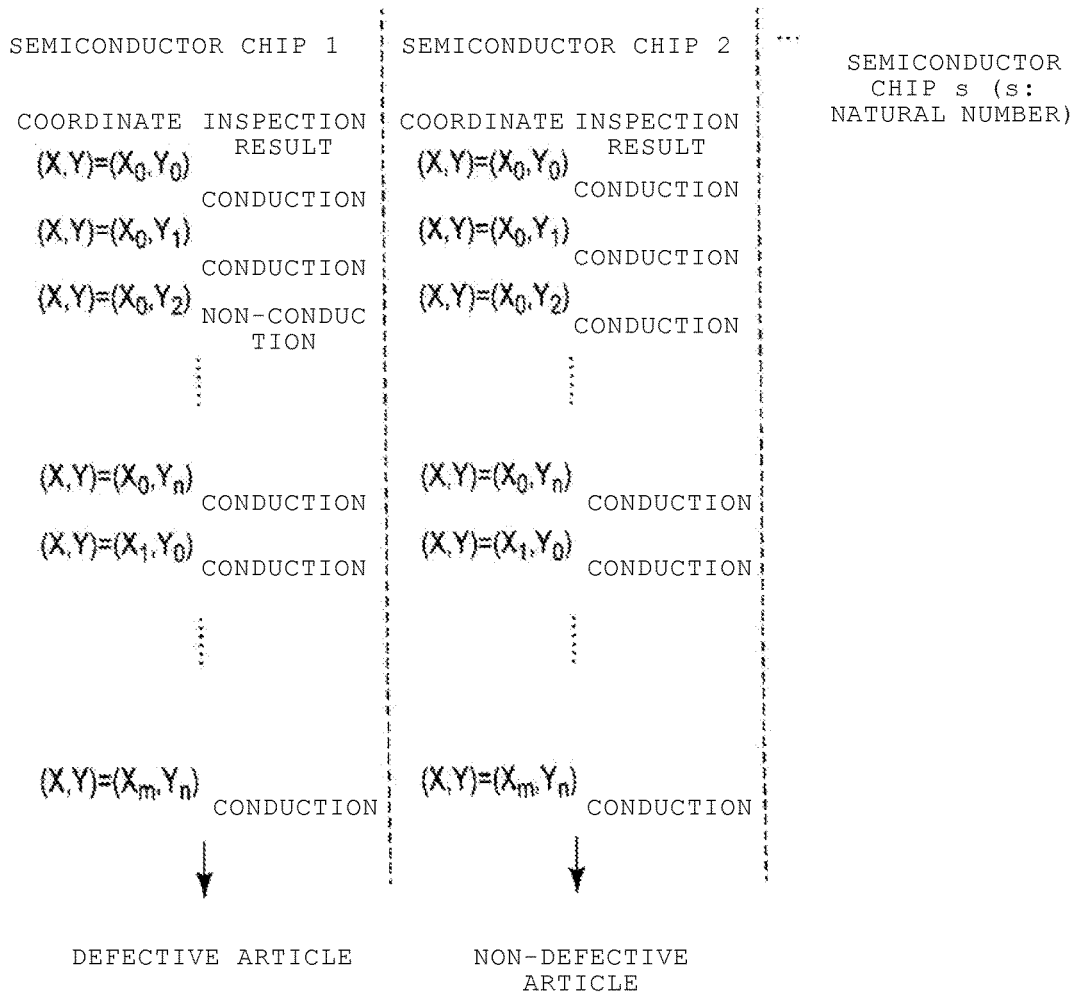
FIG. 7 is a conceptual diagram of a test result of each semiconductor chip displayed on a monitor.

FIG. 7 is a conceptual diagram illustrating conduction and non-conduction of the TSVs displayed on the monitor 61 along with the position data. It is possible to exclude a semiconductor chip, in which a TSV defect is found, based on this result.

FIG. 7 shows a result of checking conduction and non-conduction of the TSVs with respect to each of a semiconductor chip 1 to a semiconductor chip s (where s is a natural number). For example, in the semiconductor chip 1, it is understood that, while the TSVs at the positions $(X_0, Y_0)$, $(X_0, Y_1)$, $(X_0, Y_n)$, $(X_1, Y_0)$, . . . , and $(X_m, Y_n)$ are electrically conducted, the TSV at the position $(X_0, Y_2)$ is not electrically conducted (m, n: natural number).

In the example of FIG. 7, it is understood that, while the semiconductor chip 1 is defective, the semiconductor chip 2 is a non-defective chip.

Effects According to First Embodiment

With the testing apparatus and the testing method according to the first embodiment, it is possible to obtain an effect (1).

(1) It is possible to shorten the testing time.

For ease of understanding of the effect, description will be provided with a comparative example. In the comparative example, the TSV defects are found using an X-ray CT scan. However, the test using the CT scan requires lots of time. For example, while about one hour is required until the CT scan ends for one semiconductor chip, with the testing apparatus according to this embodiment, the test may end in about tens of seconds.

Accordingly, in order to test plural semiconductor chips in one silicon wafer, it is possible to perform a test in a shorter time period compared to the comparative example.

(2) It is possible to improve reliability (1).

In the CT scan described in the comparative example, the TSVs provided in the semiconductor chip are visually recognized, but it may be hard to determine whether or not the TSVs have the open defects because of a low image resolution. However, in this embodiment, since conduction and non-conduction of the TSVs are electrically tested, a defect is less likely to be overlooked.

From the above, in the testing apparatus according to the first embodiment, it is possible to improve reliability of the test of TSVs.

(3) It is possible to improve reliability (2).

This effect will be described with a comparative example. When the CT scan is used, the TSVs provided in the semiconductor chip are visualized by an X-ray. For this reason, there is a certain level of damage to the semiconductor element. This causes degradation of a quality of the semiconductor chip, and reliability in operation is insufficient.

However, with the testing apparatus according to the first embodiment, since an X-ray is not used, there is little damage to a semiconductor element, and operation reliability is not degraded during the test of a semiconductor chip.

Second Embodiment

Next, a testing apparatus and a testing method according to a second embodiment will be described referring to FIGS. 8A, 8B, and 9. The second embodiment is different from the first embodiment in that conductive sheets 2 are attached to the rear surface of the silicon wafer for respective semiconductor chips arranged along a column in the Y coordinate direction, and an ammeter 4 is electrically connected to each conductive sheet 2. That is, in this embodiment, a plurality of ammeters 4 is used. In the following embodiments, only a configuration different from the first embodiment will be described.

1. Silicon Wafer

Figure 8A:
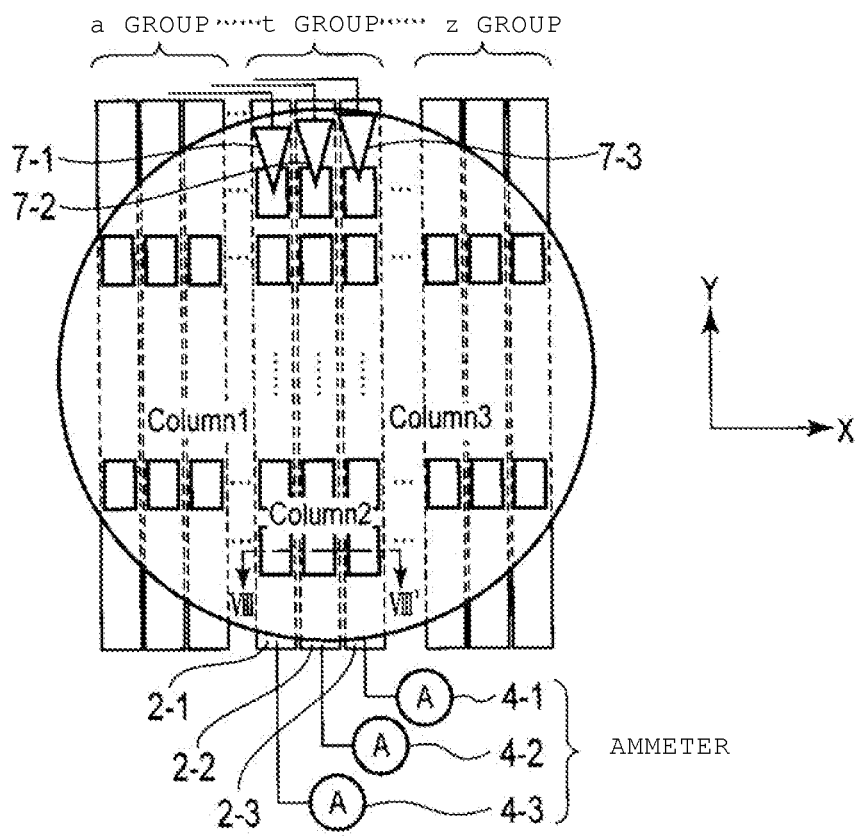
FIGS. 8A and 8B are views of a silicon wafer and a conductive sheet used in a testing method according to a second embodiment.
Figure 8B:
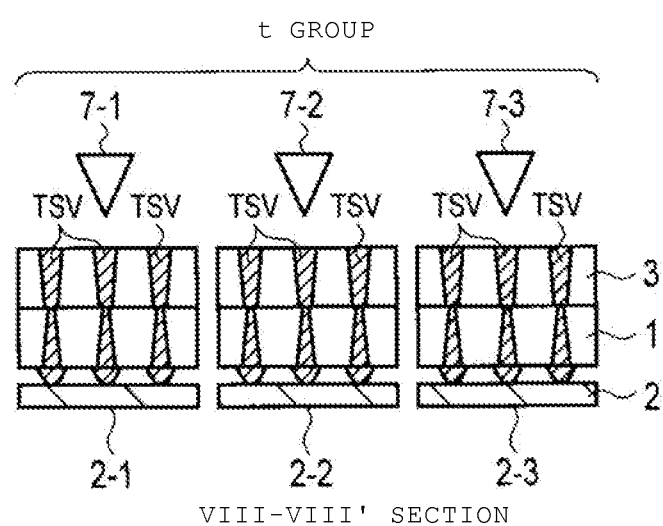

FIGS. 8A and 8B are diagrams illustrating a state where the conductive sheets 2 are attached to the silicon wafer according to the second embodiment, FIG. 8A is a top view of the silicon wafer, and FIG. 8B is a sectional view of the silicon wafer taken along a line VIII-VIII' in FIG. 8A.

As illustrated in FIGS. 8A and 8B, the conductive sheets 2 are attached to the rear surface of the silicon wafer for respective semiconductor chips arranged along a column in the Y coordinate direction. Here, for example, three columns of conductive sheets 2 are one set (group).

As illustrated in the drawing, the semiconductor chip columns are divided into a group to z group. Accordingly, three columns of conductive sheets 2 are attached to the rear surface of the silicon wafer for each group.

In the second embodiment, for example, as illustrated in FIG. 8B, the three conductive sheets 2 provided in the t group are represented by conductive sheets 2-1, 2-2, and 2-3, and adjacent conductive sheets 2-1 to 2-3 are electrically insulated from each other.

In order to perform TSV test group by group, the number of the needles 7 and the ammeters 4 correspond to the number of columns in a group (in this case, for example, three columns).

Hereinafter, as illustrated in FIG. 8A, the needles 7 are represented by needles 7-1, 7-2, and 7-3, and the corresponding ammeters 4 are represented by ammeters 4-1, 4-2, and 4-3.

2. Configuration Example of Testing Apparatus

Next, a configuration example of an EBAC device 10 according to the second embodiment will be described referring to FIG. 9.

Figure 9:
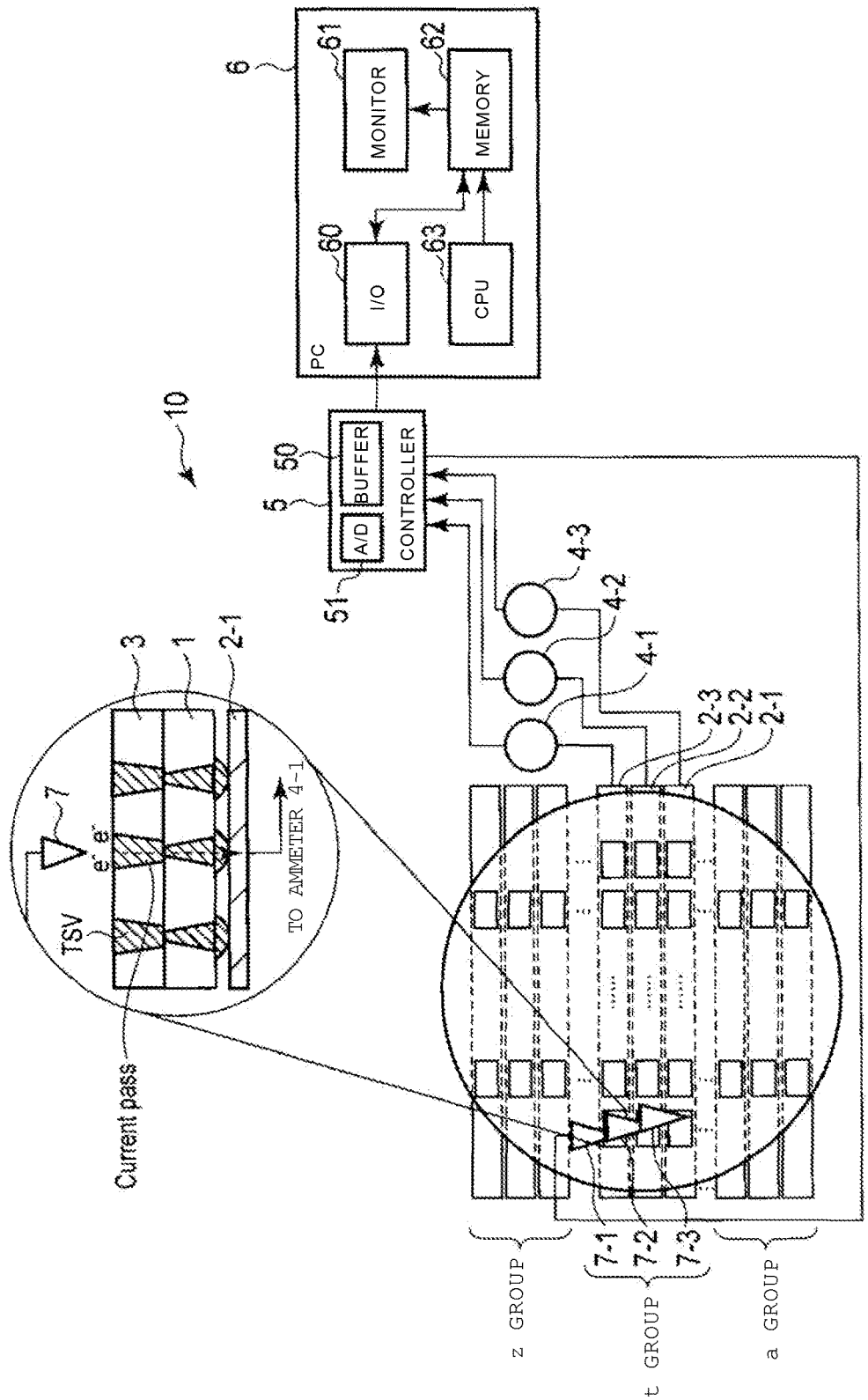
FIG. 9 is a configuration diagram of a testing apparatus according to the second embodiment.

As illustrated in FIG. 9, for example, the needle 7-1 is disposed on the semiconductor chip along a first column in the t group, the needle 7-2 is disposed on the semiconductor chip along an adjacent second column, and the needle 7-3 is disposed on the semiconductor chip along an adjacent third column.

The input terminals of the ammeters 4-1 to 4-3 are respectively connected to the conductive sheets 2-1 to 2-3 corresponding to the columns of the semiconductor chips of the t group, and the outputs terminals of the ammeters 4-1 to 4-3 are connected to the A/D converter 51 in the controller 5. In this case, the output terminals of the ammeters 4-1 to 4-3 may be connected to one A/D converter 51 or three A/D converters 51, respectively. In later case, for example, the ammeter 4-1 may be connected to one of the three A/D converters 51.

The controller 5 stores a voltage level ("H" level or "L" level) supplied from each of the ammeters 4-1 to 4-3 and converted by the A/D converter 51 and position data associated with the voltage level in the buffer 50.

Specifically, for example, if it is assumed that the test result for the X coordinate=$X_0$ is supplied from the ammeter 4-1, the buffer 50 stores the position data of the Y coordinates=$Y_0$ to $Y_n$ at the X coordinate=$X_0$ and the corresponding voltage levels in a state of being associated with each other.

Hereinafter, similarly, it is assumed that, for example, the test result for the X coordinate=$X_1$ is supplied from the ammeter 4-2 and the test result for the X coordinate=$X_2$ is supplied from the ammeter 4-3.

Note that the buffer 50 may store the position data of the X coordinates=$X_0$ to $X_n$ at the Y coordinate=$Y_0$ and the corresponding voltage levels in a state of being associated with each other. The same applies to the Y coordinate=$Y_1$ and the Y coordinate=$Y_2$.

With this, the controller 5 may store the test results of the TSVs of the respective columns (in FIG. 8A, Column 1, Column 2, and Column 3) in the buffer 50.

Thereafter, the controller 5 supplies data stored in the buffer 50 to the memory 62.

The controller 5 operates the needles 7-1, 7-2, and 7-3, independently. This is because the ammeters 4-1, 4-2, and 4-3 are disposed on the conductive sheets 2-1, 2-2, and 2-3 correspondingly attached to the columns of the semiconductor chips to be tested, and the needles 7-1, 7-2, and 7-3 separately perform the same operation as in the first embodiment.

The CPU 63 outputs the test result of the t group and the position data transferred to the memory 62 through the input and output unit 60 to the monitor 61.

Accordingly, the test results of the respective columns (in FIG. 8A, Column 1, Column 2, and Column 3) of the t group are displayed on the monitor 61.

Next, the operation of the controller 5 according to this embodiment is the same as FIG. 4, and, thus, description thereof will be omitted.

In regard to the operation (flowchart) of the testing apparatus according to this embodiment, each of the needles 7-1 to the needle 7-3 is the same as FIG. 4, and, thus, description thereof will be omitted.

Effects According to Second Embodiment

In the testing apparatus according to the second embodiment, it is possible to obtain the above-described effects (1) to (3). That is, it is possible to improve the test speed and operation reliability.

Third Embodiment

Next, a testing apparatus and a testing method according to a third embodiment will be described referring to FIGS. 10A to 12. In the third embodiment, as in the first embodiment, one conductive sheet 2 is attached to the rear surface of a silicon wafer; however, the third embodiment is different from the first embodiment in that three needles 7-1 to 7-3 are sequentially driven to test the corresponding TSVs. Hereinafter, description of the same configuration as in the foregoing embodiments will be omitted.

1. Silicon Wafer

Figure 10A:
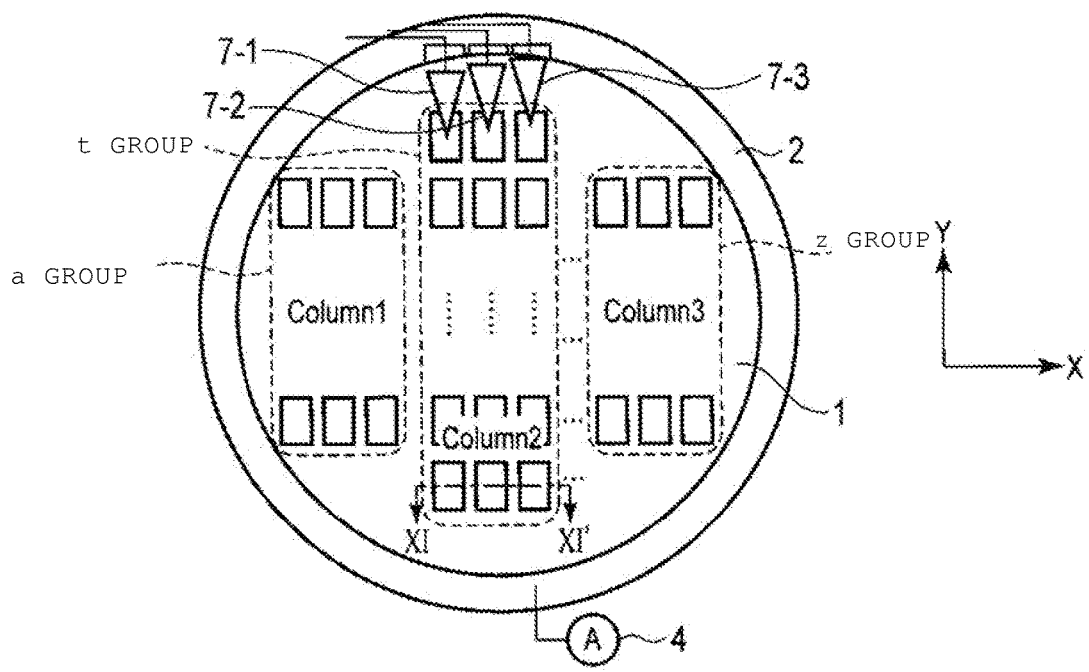
FIGS. 10A and 10B are views of a silicon wafer and a conductive sheet used in a testing method according to a third embodiment.
Figure 10B:
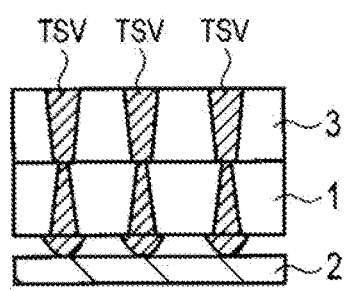

As illustrated in FIGS. 10A and 10B, a configuration in which a conductive sheet described below is attached to a silicon wafer according to the third embodiment is the same as in the first embodiment.

FIG. 10A is a top view of the silicon wafer, and FIG. 10B is a sectional view of the silicon wafer taken along a line XI-XI' in FIG. 10A. FIG. 10A shows a state where the conductive sheet 2 is attached to the rear surface of the silicon wafer.

In this embodiment, three columns of semiconductor chips arranged along the X coordinate direction are one set (group). That is, as in the second embodiment, columns of the semiconductor chips are divided into a group, b group, . . . , and z group, each including three columns, from the left end of the silicon wafer.

In this embodiment, a plurality of needles 7 is disposed for each group, and the test is carried out.

2. Configuration Example of Testing Apparatus

Next, a configuration example of the testing apparatus according to the third embodiment will be described referring to FIG. 11. Description of the same configuration as in the second embodiment will not be repeated.

Figure 11:
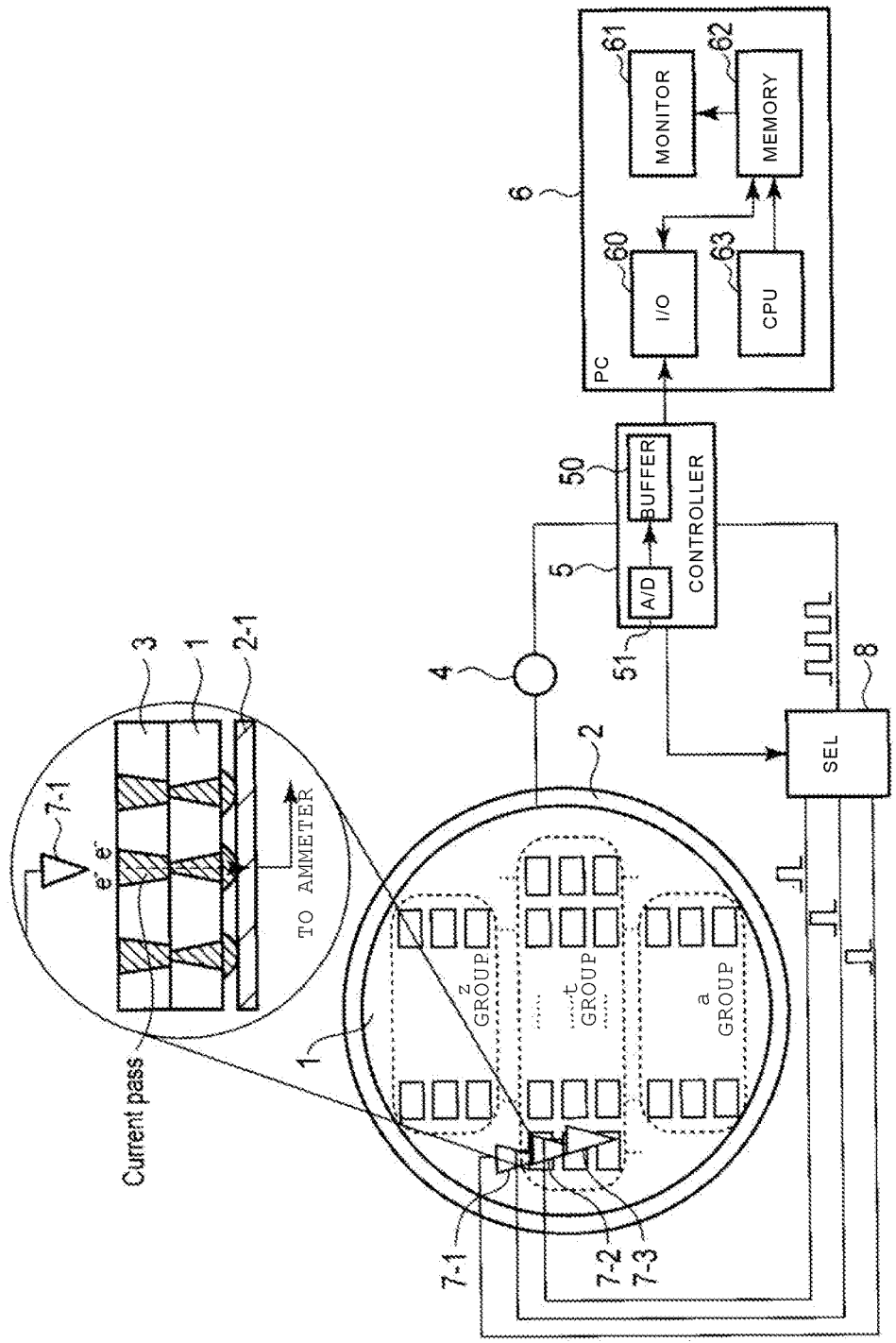
FIG. 11 is a configuration diagram of a testing apparatus according to the third embodiment.

As illustrated in FIG. 11, the input terminal of the ammeter 4 is connected to the conductive sheet 2, and the output terminal of the ammeter 4 is connected to the A/D converter 51 in the controller 5.

Here, since three needles 7 that move over the TSVs are used (in the drawing, needle 7-1, needle 7-2, and needle 7-3), if the needle 7-1 to the needle 7-3 simultaneously emit electron beams to the corresponding TSVs, the test result of either TSV is output to the input terminal of the ammeter 4.

For this reason, in the third embodiment, a selector 8 is further provided. That is, a drive signal output from the controller 5 is sequentially distributed to the needle 7-1 to the needle 7-3 by the selector 8.

Figure 12:
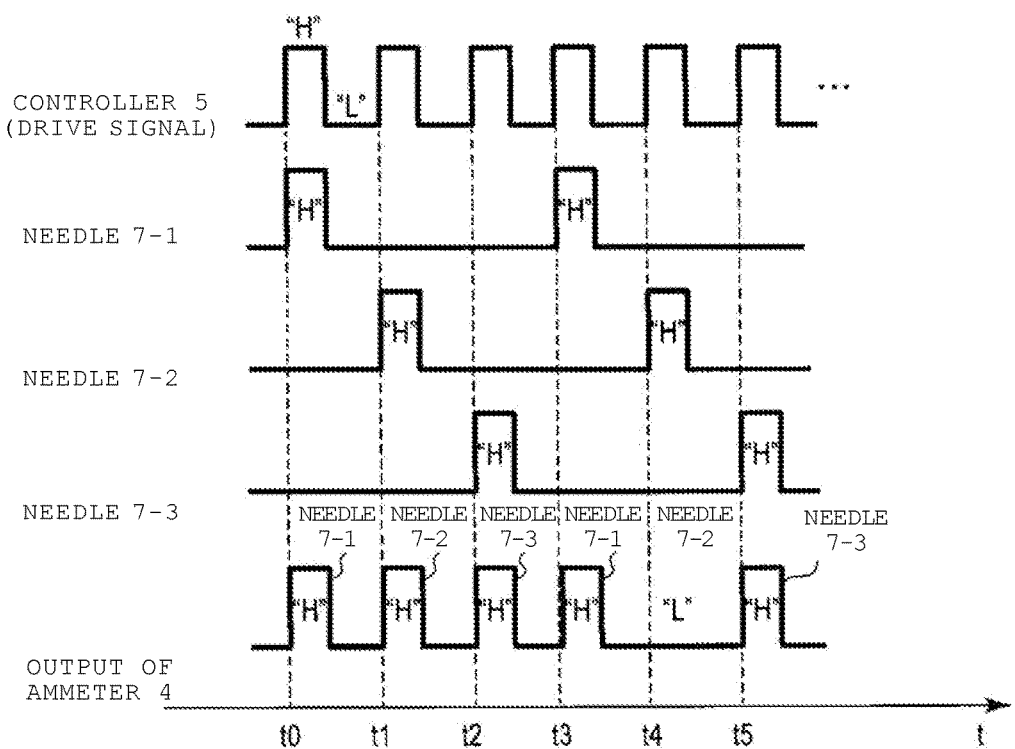
FIG. 12 is a time chart of a drive signal and an output signal generated in the testing method according to the second embodiment.

This distribution of the driving signal is illustrated in FIG. 12. FIG. 12 is a time chart of the drive signal output from the controller 5, the drive signal output to the needle 7-1 to the needle 7-3 through the selector 8, and the test result (output signal) from the ammeter 4. The output of the ammeter 4 is described as an A/D converted digital value.

It is assumed that the controller 5 recognizes the frequency of the output signal from the ammeter 4. For this reason, the controller 5 recognizes a signal width output from the ammeter 4 illustrated in FIG. 12.

That is, for example, the test result at the time t4 is "L" level. The controller 5 recognizes the output at the time t4 as the test result by the needle 7-2 based on a frequency stored in advance.

In this way, even if a plurality of ammeters 4 are not provided, since the controller 5 understands the output timing from each of the needle 7-1 to the needle 7-3, it is possible to perform TSV test with one ammeter 4.

3. Operation of Testing Apparatus

Next, the operation of the testing apparatus in the third embodiment will be described referring to FIG. 13.

Figure 13:
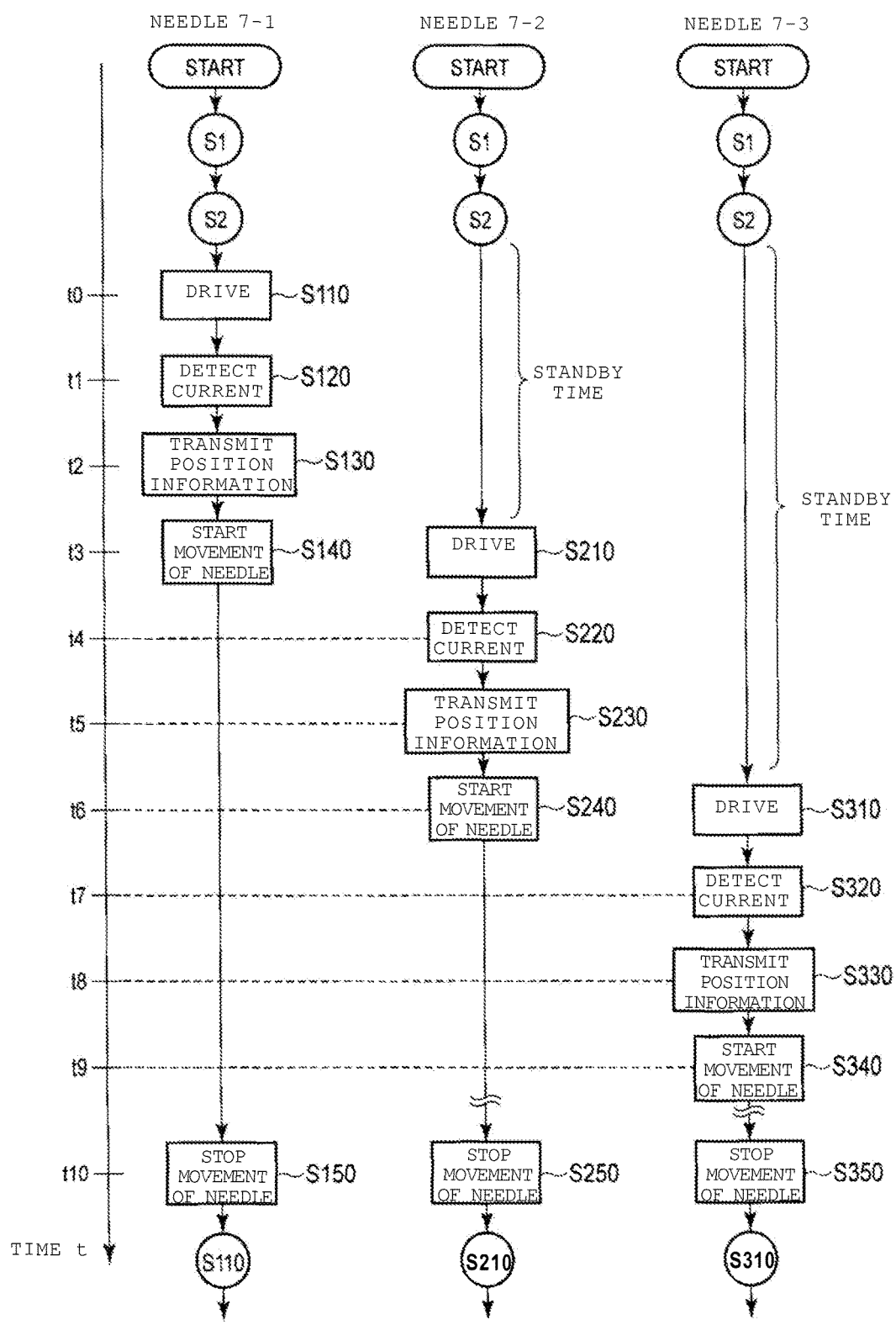
FIG. 13 is a flowchart for detecting TSV defects carried out in the testing method according to the third embodiment.

FIG. 13 is a flowchart of the needles 7-1, 7-2, and 7-3 when the vertical axis is the time t.

First, the operation of Steps S1 and S2 is performed for the needles 7-1, 7-2, and 7-3. Thereafter, the controller 5 supplies the drive signal to the needle 7-1 at the time t0 to drive the needle 7-1 (S110).

Next, an electron beam is emitted from the needle 7-1 toward the TSV at the time t1 according to the drive signal, and the ammeter 4 detects a current flowing through the TSV and the conductive sheet 2 (S120), and the controller 5 transmits the current value (digital value) and the associated position data to the PC 6 through the buffer 50 (S130).

Thereafter, the needle 7-1 starts to move towards the next TSV at the time t3 (S140).

Since neither needle emits an electron beam to the TSV at this timing, the needle 7-2 that is on stands by is driven (S210). That is, the above-described current detection and transmission of the detection result and the position data to the PC 6 are executed at the time t4 and the time t5 (S220 and S230), respectively. Thereafter, the needle 7-2 starts to move towards the next TSV (S240).

That is, as illustrated in FIG. 13, the needle 7-1 and the needle 7-2 move towards the next TSVs in parallel at this time.

Since neither needle emits an electron beam to the TSV at this timing, next, the needle 7-3 that is on stands by is driven (S310). That is, the above-described current detection and transmission of the detection result and the position data to the PC 6 are executed at the time t7 and the time t8 (S320 and S330), respectively. Thereafter, the needle 7-3 starts to move towards the next TSV (S340).

That is, as illustrated in FIG. 13, the needle 7-1 to the needle 7-3 move towards the next TSVs in parallel at this time.

Thereafter, when the needle 7-1 reaches the next TSV, the movement of the needle 7-1 is stopped (S150), and the operation of S110 to S140 is executed again.

A period in which the needle 7-1 performs the operation of S110 to S140 may be during a period in which the needle 7-2 and the needle 7-3 are moving to the next TSVs, or a period in which the needles reach the next TSVs and stands by for the operation of S210 and S310, respectively. That is, in FIG. 13, any operation may be performed insofar as the execution timing of Step S120, Step S220, and Step S320 is different. For example, when the needle 7-1 executes S120, S210 may be executed by the needle 7-2, and S130 and S220 may be executed simultaneously.

Fourth Embodiment

Next, a testing apparatus and a testing method according to a fourth embodiment will be described. In the fourth embodiment, a mechanism that is provided with a plurality of output holes for emitting an electron beam is employed. Hereinafter, only a configuration different from the first to third embodiments will be described.
1. Silicon Wafer and Conductive Sheet 2

As a silicon wafer and a conductive sheet 2 according to the fourth embodiment, the silicon wafer and the conductive sheet 2 described in the first to third embodiments may be used. That is, the silicon wafer and the conductive sheet 2 described in the first embodiment may be used, or the silicon wafer and the conductive sheet 2 in the second embodiment may be used.

Of course, the number of ammeters in the EBAC device 10 may be variable depending on which conductive sheet 2 is used.
2. Configuration Example of Testing Apparatus Next, a configuration example of the testing apparatus will be described referring to FIGS. 14 and 15. Here, a silicon wafer and a mechanism that emits an electron beam toward the silicon wafer will be described.

Figure 14:
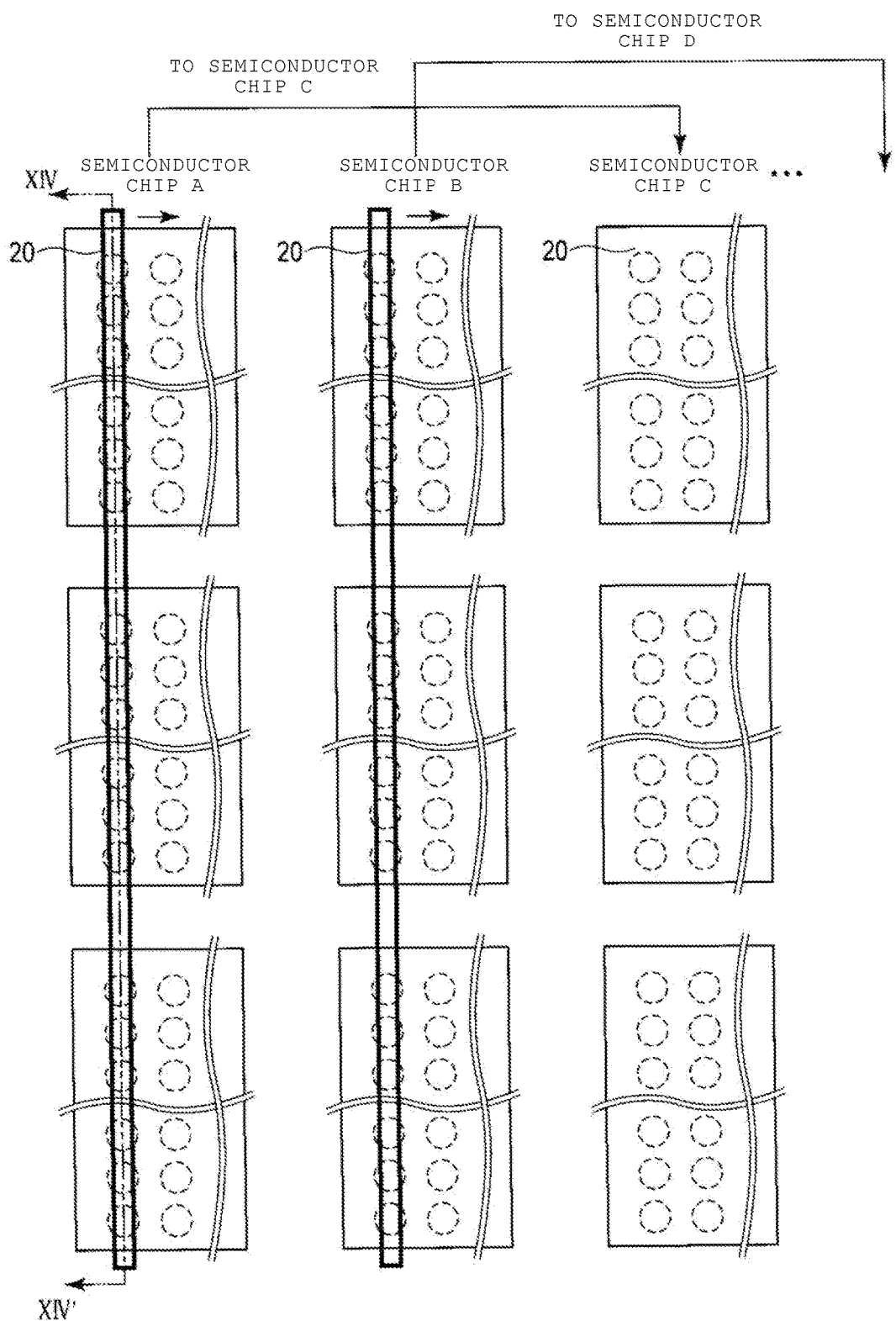
FIG. 14 is an enlarged view of a testing apparatus according to a fourth embodiment.
Figure 15:
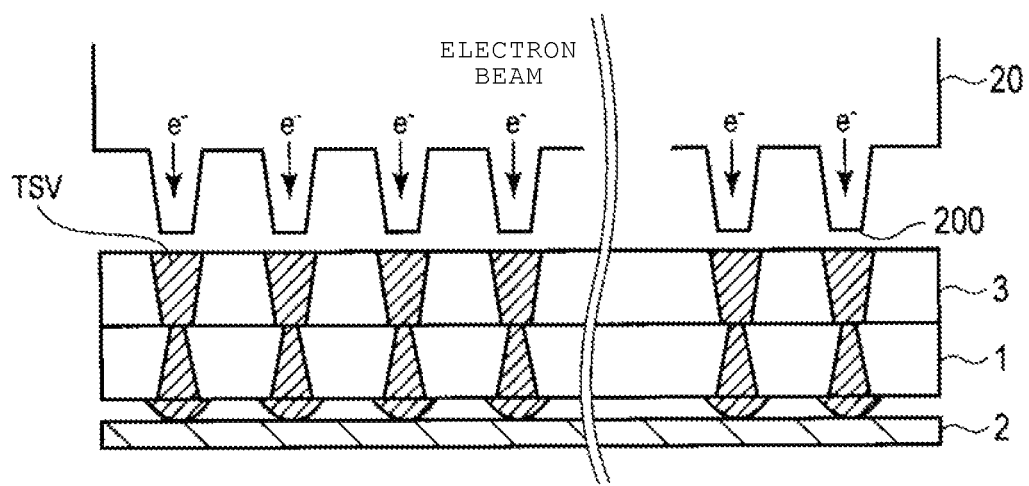
FIG. 15 is a sectional view of the testing apparatus according to the fourth embodiment.

FIG. 14 is an enlarged view of the silicon wafer disposed on the EBAC 10, and is a plan view of a mechanism (hereinafter, referred to as a mechanism 20) that emits an electron beam to the TSVs of the silicon wafer from the top. FIG. 15 is a sectional view of the silicon wafer and the mechanism taken along the line XIV-XIV' of FIG. 14.

In FIG. 14, as an example, it is assumed that the number of columns of the semiconductor chips is "3" and the columns of the semiconductor chips are represented by "A", "B", and "C" from the left.

The mechanisms 20 are respectively provided along the column "A" and the column "B". As illustrated in FIG. 14, the mechanisms 20 are disposed over the TSVs in a direction along the columns.

Hereinafter, the structure of the mechanism 20 will be described referring to FIG. 15.

As illustrated in FIG. 15, the mechanism 20 includes a selection circuit (not illustrated), and a plurality of needles 7 each having an output unit 200 (described below) configured to emits an electron beam toward the corresponding TSV.

The mechanism 20 performs operation such that, if an adjacent needle 7 is non-selected, the next needle 7 is selected simultaneously, and emits an electron beam from the output unit 200 of the selected needle 7 toward the corresponding TSV during the test. The selection and non-selection of the needle 7, and the timing are controlled by the controller 5.

Then, if a predetermined needle 7 is selected by the selection circuit (not illustrated), an electron beam is emitted from the tip of the appropriate output unit 200 toward the TSV.

For example, the selection circuit includes a plurality of MOS transistors Tr arranged in a matrix form. For example, a current path is formed by a plurality of MOS transistors Tr in the ON state, thereby selecting a desired needle 7.

Figure 16:
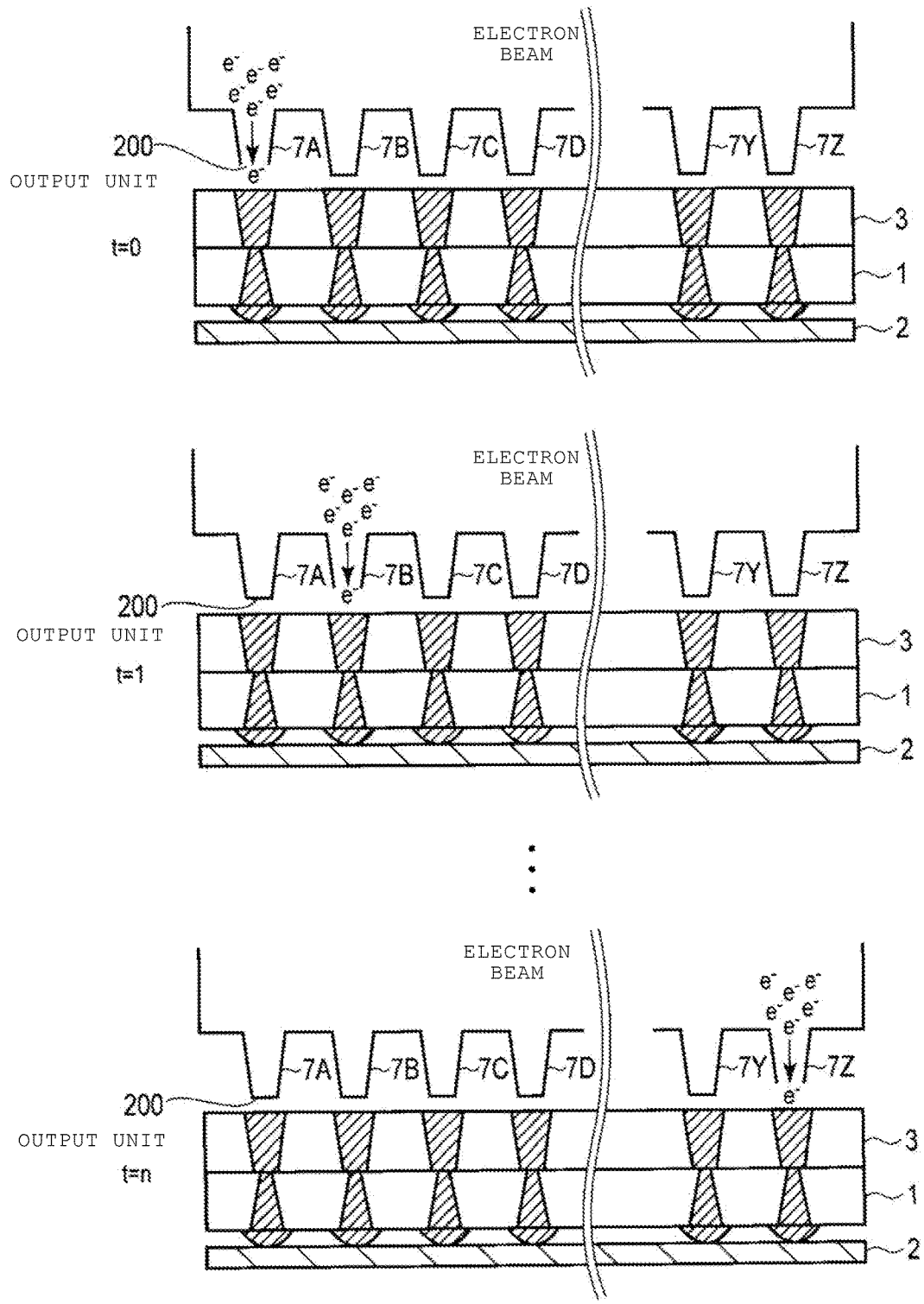
FIG. 16 is a conceptual diagram of the testing apparatus according to the fourth embodiment to explain operation of the testing apparatus.

Next, the operation of the mechanism 20 will be described with referring to FIG. 16. FIG. 16 is a conceptual diagram illustrating the mechanism 20 when the mechanism 20 sequentially selects the needles 7 and sequentially emits an electron beam from the output units 200 toward the TSVs.

As illustrated in FIG. 16, a needle 7A is selected by the selection circuit at the time t0, and an electron beam is emitted from the corresponding output unit 200 toward the TSV.

Next, the needle 7A is non-selected by the selection circuit at the time t1, and a needle 7B is selected by the selection circuit. For this reason, an electron beam is emitted from the output unit 200 of the needle 7B toward the TSV.

Subsequently, similarly, the needle 7B is non-selected by the selection circuit at the time t2, and a needle 7C is next selected by the selection circuit. This is sequentially repeated to a needle 7Z.

Thereafter, if the emission of an electron beam ends for one column, as illustrated in FIG. 14, the mechanisms 20 respectively disposed over semiconductor chips A and B are moved in the X direction, and the above-described operation is executed for the next columns in the same semiconductor chips (for example, A and B).

If this operation ends to the last columns in the same semiconductor chips, as illustrated in FIG. 14, subsequently, the mechanisms 20 move to the columns of the next semiconductor chips (the semiconductor chip A⇒ the semiconductor chip C and the semiconductor chip B⇒ the semiconductor chip D), and the above-described operation is executed.

In FIG. 16, although the output unit 200 of the selected needle 7 is open, this is just a concept, and actually, an electron beam is emitted from the tip of the needle 7.

The determination on which TSV is defective is the same as in the foregoing embodiment, thus, description thereof will not be repeated.

In the first to fourth embodiments, although the position information for a TSV determined to be not electrically conducted or for all TSVs is displayed on the monitor 61, the display method is not limited thereto.

For example, in addition to the coordinate of the TSV and the conduction result, the image of the TSV may be further displayed on the monitor 61.

While certain embodiments have been described, these embodiments have been presented by way of example only, and are not intended to limit the scope of the invention. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A testing apparatus for a wafer having a plurality of semiconductor chips in a matrix form, each of the semiconductor chips including a plurality of conductive vias, the apparatus comprising:
   an electron beam discharging device including a plurality of tips arranged in a first direction of the matrix form, each of the tips being configured to discharge an electron beam to one of the conductive vias of one of the semiconductor chips, and to move along a second direction of the matrix form;
   a detector configured to generate a detection signal corresponding to a current flowing through the conductive vias, the detector including a conductive sheet on which the semiconductor chips are placed so that the vias of the semiconductor chips are electrically connected to the conductive sheet; and
   a controller configured to control the electron beam discharging device such that the electron beam is discharged from each of the tips at a different timing and record a value of the detection signal flowing through the conductive sheet in association with a position of the conductive vias.

2. The testing apparatus according to claim 1, wherein the controller is further configured to convert the value of the detection signal, and
   the value of the detection signal associated with the position of the semiconductor chip is a converted value of the detection signal.

3. The testing apparatus according to claim 1, wherein the controller includes a storage device in which the value of the detection signal is stored in association with the position of the one of the conductive vias.

4. The testing apparatus according to claim 1, further comprising:
   a stage on which the wafer is to be placed and that is configured to move the wafer along the surface direction thereof.

5. The testing apparatus according to claim 4, wherein the controller is further configured to adjust an orientation of the stage such that a column or a row direction of the semiconductor chips is parallel to a direction in which the tips move.

6. The testing apparatus according to claim 5, wherein the controller is further configured to adjust positions of the tips such that the tips pass above conductive vias arranged along the column or the row direction when the tips move.

7. The testing apparatus according to claim 1, wherein the tips are configured to move in the second direction independently from each other.

8. A method for testing a wafer having a plurality of semiconductor chips in a matrix form, provided on a conductive sheet, each of the semiconductor chips including a plurality of conductive vias electrically connected to the conductive sheet, the method comprising:
   discharging an electron beam, at a different timing, from each of a plurality of tips of an electron beam discharging device that are arranged in a first direction of the matrix form, to one of the conductive vias of one of the semiconductor chips, and moving the tips in a second direction of the matrix form;
   detecting a current flowing through the conductive vias and the conductive sheet and generating a detection signal corresponding to the current; and
   recording a value of the current in association with a position of the conductive vias.

9. The method according to claim 8, further comprising:
   converting the value of the detection signal,
   wherein the value of the detection signal associated with the detected position is the converted value of the detection signal.

10. The method according to claim 8, further comprising:
    moving the plurality of tips along a surface direction of the wafer.

11. The method according to claim 10,
    further comprising:
    adjusting an orientation of a stage on which the wafer is placed such that a column or a row direction of the semiconductor chips is parallel to a direction in which the tips are moved.

12. The method according to claim 11, further comprising:
    adjusting positions of the tips such that the tips pass above the conductive vias arranged along the column or the row direction when the electron beam discharging device is moved.

13. The method according to claim 8, wherein the moving of the electron beam discharging device comprises moving the tips in the second direction independently from each other.

14. A testing apparatus for a wafer having a plurality of semiconductor chips arranged in a matrix form, each of the semiconductor chips including a plurality of conductive vias, the apparatus comprising:
    an electron beam discharging device having a plurality of tips arranged along a first direction of the matrix form, each of the tips being configured to move along a second direction of the matrix form and discharge an electron beam to conductive vias arranged along the second direction one at a time;
    a plurality of detecting devices, each configured to generate a detection signal corresponding to a current flowing through each of the conductive vias to which an electron beam is discharged from one of the tips;
    a conductive sheet on which the semiconductor chips are placed so that so that the vias of the semiconductor chips are electrically connected to the conductive sheet; and
    a controller configured to control the electron beam discharging device such that the electron beam is discharged from each of the tips at a different timing and record a value of each detection signal flowing through the conductive sheet in association with a position of the corresponding conductive via.

15. The testing apparatus according to claim 14, wherein the detecting devices are electrically separated from each other.

16. The testing apparatus according to claim 14, wherein the tips are configured to move independently from each other.

* * * * *